US008828851B2

(12) United States Patent
Loubet et al.

(10) Patent No.: US 8,828,851 B2
(45) Date of Patent: Sep. 9, 2014

(54) METHOD TO ENABLE THE FORMATION OF SILICON GERMANIUM CHANNEL OF FDSOI DEVICES FOR PFET THRESHOLD VOLTAGE ENGINEERING

(75) Inventors: Nicolas Loubet, Guilderland, NY (US); Prasanna Khare, Schenectady, NY (US); Qing Liu, Guilderland, NY (US)

(73) Assignee: STMicroeletronics, Inc., Coppell, TX (US)

( * ) Notice: Subject to any disclaimer, the term of this patent is extended or adjusted under 35 U.S.C. 154(b) by 0 days.

(21) Appl. No.: 13/487,583

(22) Filed: Jun. 4, 2012

(65) Prior Publication Data

US 2013/0193514 A1    Aug. 1, 2013

Related U.S. Application Data

(60) Provisional application No. 61/593,633, filed on Feb. 1, 2012.

(51) Int. Cl.
*H01L 21/336* (2006.01)
*H01L 21/20* (2006.01)
*H01L 29/78* (2006.01)

(52) U.S. Cl.
USPC 438/479; 257/347; 257/E21.09; 257/E21.409; 257/E29.255; 438/151; 438/275; 438/276

(58) Field of Classification Search
CPC .................. H10L 21/28255; H10L 21/31658; H10L 29/7378; H10L 27/04; H10L 27/1203; H10L 21/784; H10L 21/70; H10L 21/84; H10L 27/1207; H10L 29/66477; H10L 29/66628; H10L 29/7848

USPC .......... 257/347, 351, E21.632; 438/479, 149, 438/480

See application file for complete search history.

(56) References Cited

U.S. PATENT DOCUMENTS

| 6,509,587 B2 * | 1/2003 | Sugiyama et al. | 257/192 |
| 6,875,982 B2 * | 4/2005 | Bedell et al. | 250/307 |
| 6,989,058 B2 * | 1/2006 | Bedell et al. | 117/4 |
| 7,037,794 B2 * | 5/2006 | Beintner et al. | 438/300 |
| 7,227,224 B2 * | 6/2007 | Ko et al. | 257/330 |

(Continued)

OTHER PUBLICATIONS

Oxford Dictionaries, "substantially", Oxford Dictionaries, Apr. 2010, Oxford Dictionaries, definition/american_english/.*

(Continued)

*Primary Examiner* — Khiem D Nguyen
*Assistant Examiner* — Pauline Vu
(74) *Attorney, Agent, or Firm* — Gardere Wynne Sewell LLP

(57) ABSTRACT

An SOI substrate has a first region isolated from a second region. An SiGe layer is deposited on top of the SOI substrate in the second region. The substrate is subjected to a thermal oxidation process which drives in Ge from the SiGe layer to form an SiGeOI structure in the second region and an overlying oxide layer. If the SOI substrate is exposed in the first region, the thermal oxidation process further produces an oxide layer overlying the first region. The oxide layer(s) is(are) removed to expose an Si channel layer in the first region and an SiGe channel layer in the second region. Transistor gate stacks are formed over each of the Si channel layer and SiGe channel layer. Raised source and drain regions are formed from the Si channel layer and SiGe channel layer adjacent the transistor gate stacks.

17 Claims, 6 Drawing Sheets

(56) References Cited

U.S. PATENT DOCUMENTS

| | | | |
|---|---|---|---|
| 7,238,588 B2 * | 7/2007 | Xiang | 438/431 |
| 7,247,534 B2 * | 7/2007 | Chidambarrao et al. | 438/223 |
| 7,282,402 B2 * | 10/2007 | Sadaka et al. | 438/221 |
| 7,365,362 B2 * | 4/2008 | Miyano | 257/65 |
| 7,414,259 B2 * | 8/2008 | Langdo et al. | 257/18 |
| 7,449,379 B2 * | 11/2008 | Ochimizu et al. | 438/199 |
| 7,675,115 B2 * | 3/2010 | Tezuka | 257/351 |
| 2002/0167048 A1 * | 11/2002 | Tweet et al. | 257/347 |
| 2003/0013305 A1 * | 1/2003 | Sugii et al. | 438/689 |
| 2003/0232459 A1 * | 12/2003 | Yasukawa | 438/57 |
| 2004/0009636 A1 * | 1/2004 | Ichinose et al. | 438/199 |
| 2004/0235264 A1 * | 11/2004 | Forbes | 438/429 |
| 2005/0245092 A1 * | 11/2005 | Orlowski et al. | 438/758 |
| 2006/0003554 A1 * | 1/2006 | Zhu et al. | 438/479 |
| 2008/0020532 A1 * | 1/2008 | Monfray et al. | 438/285 |
| 2008/0135886 A1 * | 6/2008 | Irisawa et al. | 257/255 |
| 2009/0166813 A1 * | 7/2009 | Matsuzawa | 257/635 |
| 2009/0294801 A1 * | 12/2009 | Harley et al. | 257/192 |
| 2011/0108943 A1 * | 5/2011 | Dennard et al. | 257/506 |
| 2012/0068267 A1 * | 3/2012 | Bedell et al. | 257/350 |
| 2013/0153964 A1 * | 6/2013 | Guo et al. | 257/192 |

OTHER PUBLICATIONS

Virginia Semiconductor, "The General Properties of Si, Ge, SiGe, SiO2 and Si3N4", Jun. 2002, 5 pages.*

Tezuka, T. et al.,"High-mobility strained SiGe-on-insulator pMOSFETs with Ge-rich surface channels fabricated by local condensation technique", Apr. 2005, Electron Device Letters, IEEE, vol. 26, No. 4, pp. 243-245.*

Tezuka, T. et al., "High-mobility strained SiGe-on-insulator pMOSFETs with Ge-rich surface channels fabricated by local condensation technique", Apr. 2005, Electron Device Letters, IEEE, vol. 26, No. 4, pp. 243-245.*

* cited by examiner

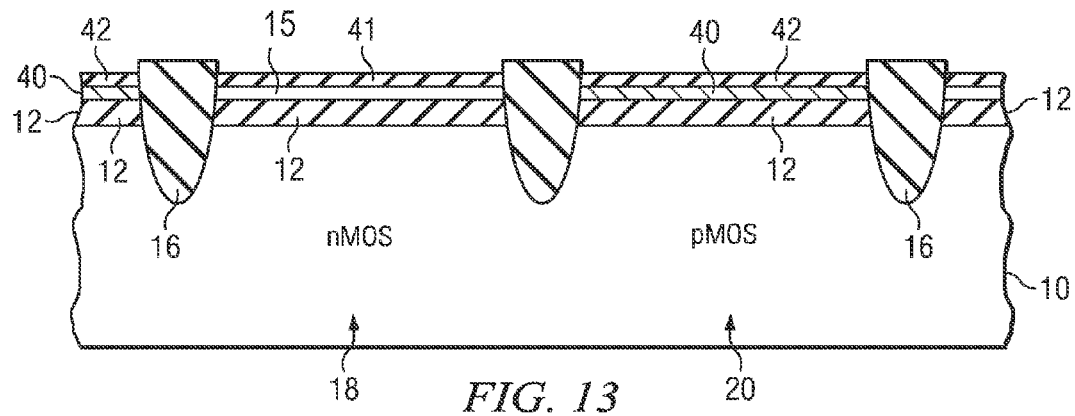
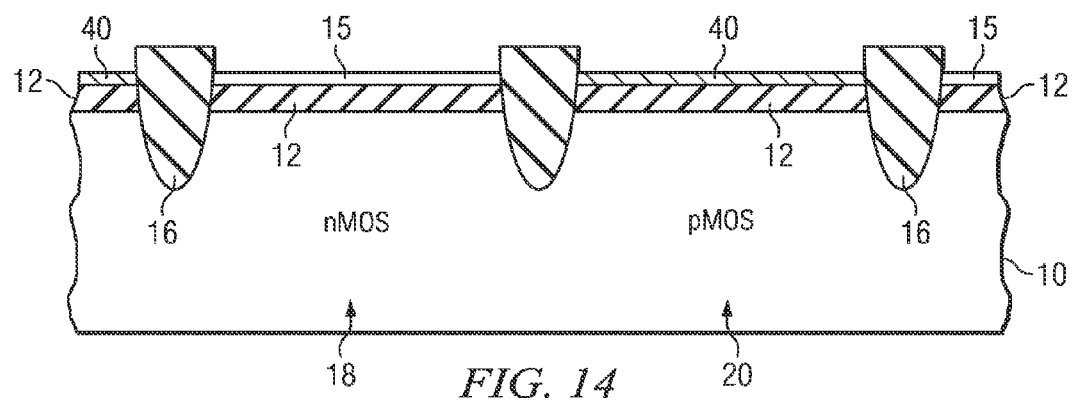
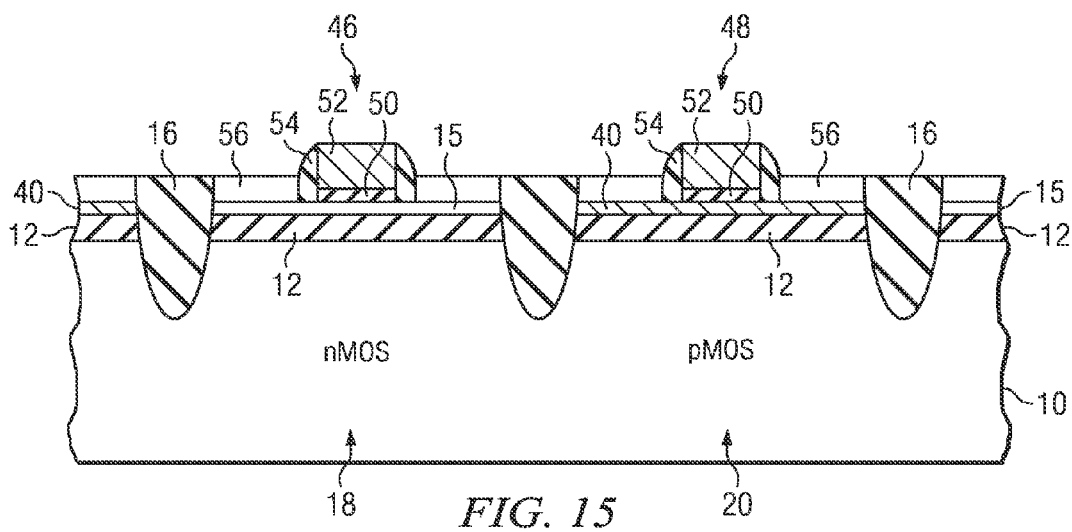

METHOD TO ENABLE THE FORMATION OF SILICON GERMANIUM CHANNEL OF FDSOI DEVICES FOR PFET THRESHOLD VOLTAGE ENGINEERING

PRIORITY CLAIM

This application claims priority from U.S. Provisional Application for Patent No. 61/593,633 filed Feb. 1, 2012, the disclosure of which is incorporated by reference.

TECHNICAL FIELD

The present invention relates to the fabrication of integrated circuits and, in particular, to a method for fabricating p-channel MOSFET devices having a silicon germanium (SiGe) channel.

BACKGROUND

On planar bulk transistor devices, the threshold voltage of a p-channel MOSFET device is routinely adjusted using silicon germanium (SiGe) as the channel material. For example, it is well known to those skilled in the art how the threshold voltage of the p-channel device can be adjusted by varying the Ge content and/or thickness of the SiGe material layer defining the channel.

Planar fully depleted silicon on insulator (FDSOI) devices are also known to those skilled in the art. FDSOI technology relies on the use of a very thin layer of silicon located over a buried oxide layer to form the channel. Transistors are then built on the thin silicon layer. FDSOI is an attractive solution as transistor sizes shrink because FDSOI supports transistor operation at much lower VDD supply voltages, with low leakage and with reduced transistor threshold voltage variability.

It is noted that the use of silicon germanium (SiGe) as the channel material in FDSOI devices presents an attractive solution enabling the adjustment of p-channel device threshold voltage without impacting device performance. The fabrication process of the prior art first protects active regions identified for the n-channel devices, and then performs a selective SiGe epitaxy on the active regions identified for the p-channel devices. This process occurs, like with conventional bulk device fabrication, prior to formation of the gate stack, where the gate stack is formed over the SiGe(epi)+SOI layer.

There are, however, issues with this fabrication process. When implementing an ultra-thin body and box (UTBB) configuration for FDSOI (for example, with a 7 nm top silicon thickness and a 25 nm buried oxide thickness), the resulting channel after selective SiGe epitaxy to form SiGe+SOI is too thick with negative impact on device short channel effects. Additionally, it is difficult to control the Ge profile in the channel region for the SiGe epitaxy following subsequent thermal treatment as the Ge profile tends to be graded in a direction perpendicular to the channel layer. As a result, there is undesirable process variability.

A need thus exists in the art for an improved process supporting the use of silicon germanium (SiGe) as the channel material in FDSOI devices.

SUMMARY

In an embodiment, a selective SiGe/Si epitaxy is realized on the p-channel active regions of a silicon on insulator (SOI) substrate, a thermal drive in of the Ge into the silicon of the SOI substrate is performed, and a thickness of the SiGeOI channel material is reduced prior to gate stack production. The drive in and reduction of thickness may be effectuated, for example, using a thermal oxidation process. The resulting oxide layer overlying the reduced thickness SiGe channel is then removed (for example, using a wet or dry chemistry etchant). The transistor gate stack is then formed over the thin SiGe channel layer.

Advantageously, Ge percent content and SiGe channel layer thickness in the p-channel active region are adjusted in accordance with the SiGe epitaxy and process characteristics of the thermal oxidation.

Advantageously, the SiGe channel thickness in the p-channel active region can substantially match the Si channel thickness in the n-channel active region.

Advantageously, the Ge profile in the SiGe channel is substantially constant, and thermal treatments have minimal adverse affect on the setting of the p-channel threshold voltage.

Advantageously, the p-channel threshold voltage is tuned directly with the Ge concentration in the thin SiGe channel layer.

In an embodiment, a method comprises: depositing an SiGe layer on top of an SOI substrate in a first region; thermally oxidizing the SOI substrate with the SiGe layer to form an SiGeOI substrate and an overlying oxide layer in the first region; and removing the overlying oxide layer. An SiGe layer of the SiGeOI substrate defines an SiGe channel layer for a first transistor (for example, of the p-channel MOS type). A second region of the SOI substrate is isolated from the first region. An Si layer of the SOI substrate in the second region defines an Si channel layer for a second transistor (for example, of the n-channel MOS type).

In an embodiment, an apparatus comprises: an SOI substrate having a first region isolated from a second region, the first region including an Si channel layer and the second region having an SiGe channel layer; wherein a thickness of the Si channel layer and SiGe channel layer are substantially equal; a first transistor gate stack formed on a top surface of the Si channel layer; and a second transistor gate stack formed on a top surface of the SiGe channel layer.

In an embodiment, a method comprises: protecting a first region of an SOI substrate from a second region; depositing an SiGe layer on top of the SOI substrate in the second region; thermally driving in Ge from the SiGe layer to form an SiGeOI structure in the second region; forming a first transistor gate stack on a top surface of an Si channel layer provided by the SOI substrate in the first region; and forming a second transistor gate stack on a top surface of an SiGe channel layer provided by the SiGeOI structure in the second region.

BRIEF DESCRIPTION OF THE DRAWINGS

For a better understanding of the embodiments, reference will now be made by way of example only to the accompanying figures in which:

FIGS. 8-14 illustrate a second process flow;

FIG. 15 illustrates a completed CMOS transistor structure from the second process.

DETAILED DESCRIPTION OF THE DRAWINGS

Reference is now made to FIGS. 1-6 which illustrate a first process flow for CMOS transistor structure fabrication.

Figure 1:
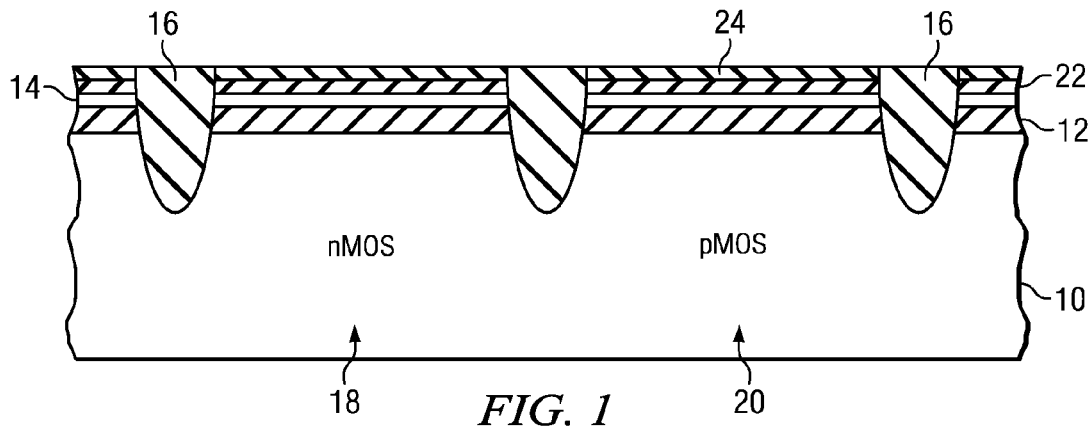
FIGS. 1-6 illustrate a first process flow.

FIG. 1 shows an SOI substrate comprising a lightly doped substrate layer 10, and overlying buried oxide (for example, $SiO_2$) layer 12, and an overlying silicon layer 14. The SOI substrate has been divided by shallow trench isolation (STI) structures 16, for example, formed of $SiO_2$, into a first active region 18 for an nMOS device and a second active region 20 for a pMOS device. The STI structures 16 penetrate through the silicon layer 14 and oxide layer 12 into the lightly doped substrate layer 10. A pad oxide (for example, $SiO_2$) layer 22 and pad nitride (etch stop) layer 24 overlie the silicon layer 14. A planarization process has been performed on the structure of FIG. 1, with that planarization process stopping at the nitride etch stop layer 24.

It will be understood that the formation of the STI structures 16 can be reserved, as will be discussed below, for later in the fabrication process if desired. In such a case, the first active region 18 and second active region 20 will be understood to be regions of the substrate that have been allocated for use by the nMOS and pMOS transistors to be fabricated in the manner described.

Figure 2:
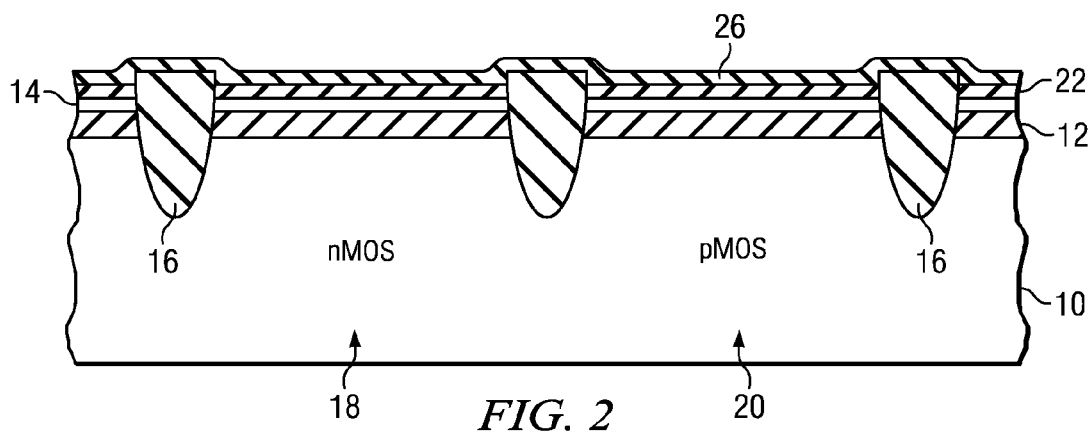

In FIG. 2, the nitride etch stop layer 24 has been removed, and a hard mask layer 26, for example, formed of SiN, has been conformally deposited. An SiN hard mask layer 26 is preferred here because of it serves as protective barrier for oxygen during the subsequent condensation process on pMOS transistor fabrication as described in detail below.

Figure 3:
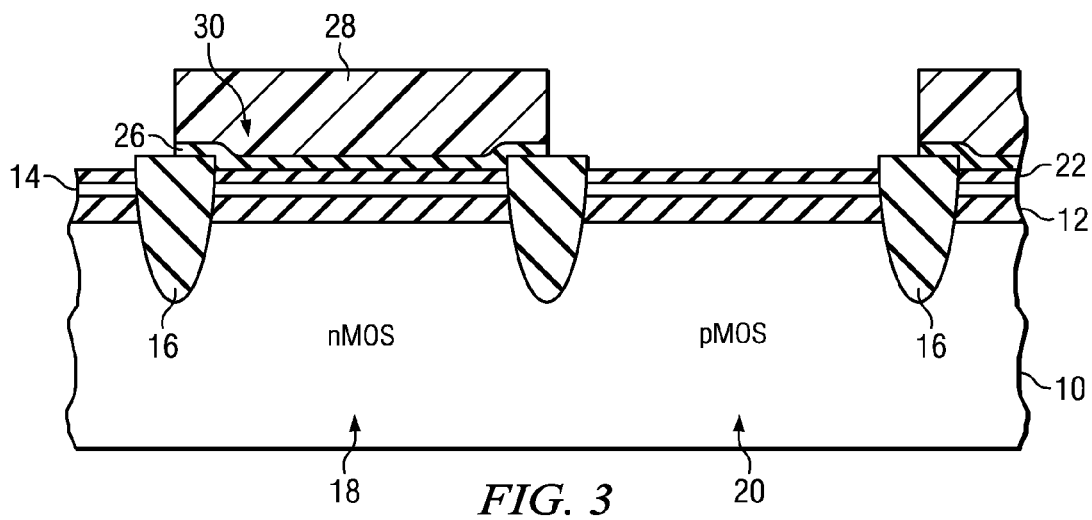

In FIG. 3, a resist material layer 28 is deposited over the hard mask layer 26. The layers 26 and 28 are patterned using conventional photolithography techniques to define a mask 30 which protects the first active region 18 identified for the n-channel devices. The layers 26 and 28 are removed from overlying the second active region 20 identified for the p-channel device.

Figure 4:
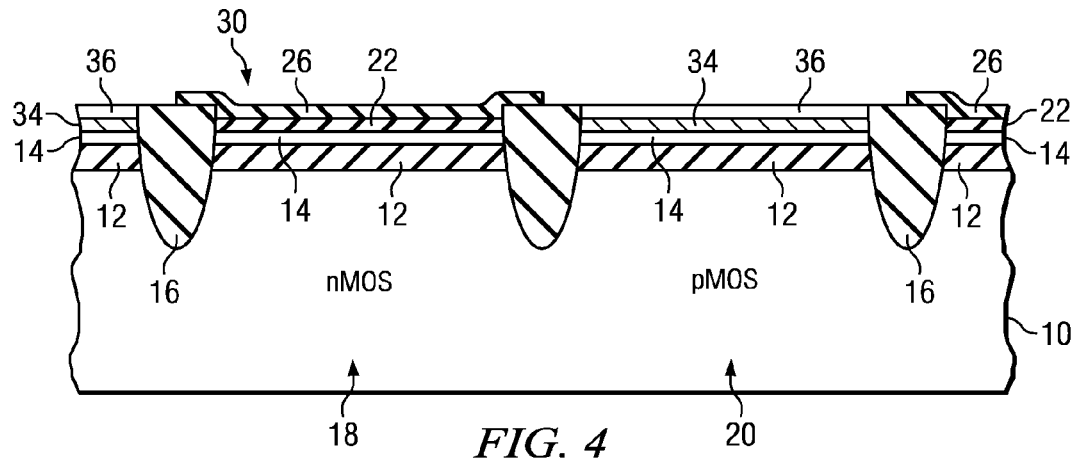

In FIG. 4, the patterned resist layer 28 is removed leaving the hard mask layer 26 associated with the defined mask 30 over the first active region 18. The pad oxide layer 22 located on the silicon layer 14 in the second active region 20 is selectively removed, and a selective epitaxial growth of SiGe is then performed on the exposed silicon layer 14 in the second active region 20 to produce an overlying SiGe layer 34 (having a Ge concentration of about 15-25%). The selective epitaxial growth process for the SiGe layer 34 preferably utilizes a cyclic epitaxy process in a manner well known to those skilled in the art. This produces an SiGe+SOI structure in the second active region 20.

An optional silicon layer 36 may be selectively epitaxially grown on the SiGe layer 34. The silicon layer 36 forms a cap. The selective epitaxial growth process for the silicon layer 36 preferably utilizes a cyclic epitaxy process in a manner well known to those skilled in the art.

Figure 5:
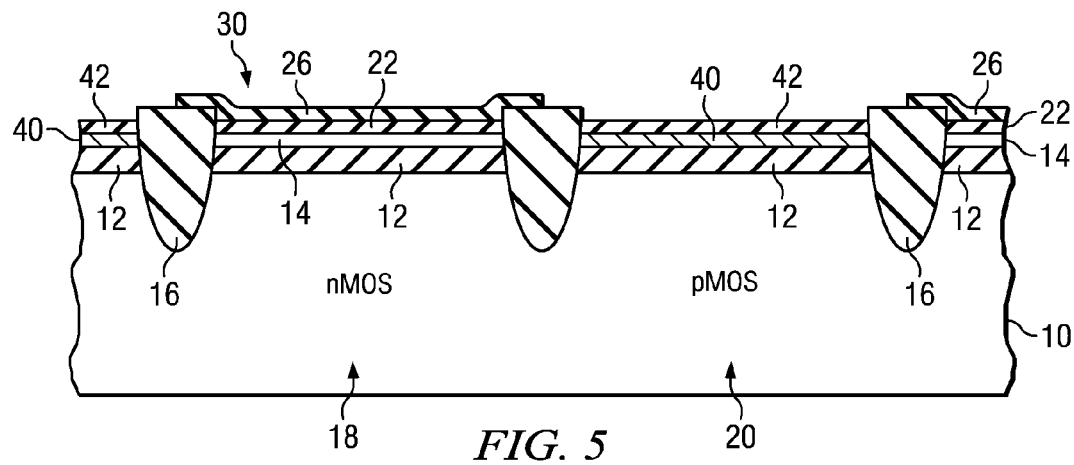

In FIG. 5, a condensation technique is performed to preferentially oxidize the Si in the second active region 20 which produces a SiGe channel layer 40 overlying the buried oxide layer 12 (i.e., an SiGeOI structure in the second active region 20). The condensation process also produces as a byproduct an oxide ($SiO_2$) layer 42 overlying the SiGe channel layer 40. This SiGe channel layer 40 has a high Ge concentration of approximately 20-30%. The SiGe channel layer 40 for the second active region 20 further has a thickness substantially equal to a thickness of the Si layer 14 for the first active region 18 (for example 5-10 nm). It will be understood that the thickness of the SiGe channel layer 40 is controlled by the thickness of the epitaxially grown SiGe layer 34 (and optional silicon cap layer 36) and the parameters of the performed condensation technique. Although a substantially equal thickness is preferred (as illustrated in FIG. 5), it will be understood that some implementations may benefit from different thicknesses in the first and second active regions 18 and 20, respectively.

The condensation technique may comprise, for example, a rapid thermal oxidation (RTO) process well known to those skilled in the art. The effect of performing the condensation technique on the Si layer 14, the epitaxial SiGe layer 34 and optional silicon cap layer 36 is drive in germanium to form a SiGeOI substrate structure with SiGe channel layer 40 in the second active region 20 and produce the overlying silicon oxide layer 42 byproduct which is subsequently removed to expose the SiGe channel layer 40 for the second active region 20.

Figure 6:
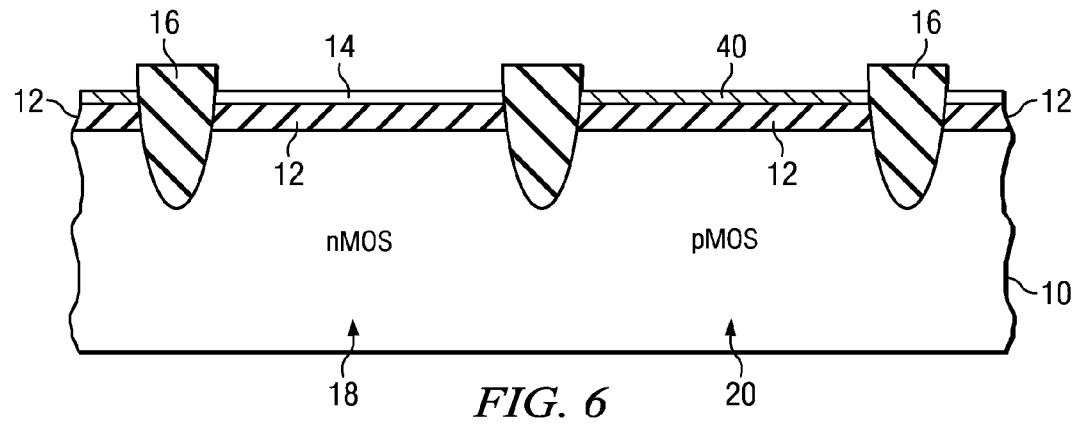

In FIG. 6, the oxide layer 42 over the second active region 20 as well as the hard mask layer 26 associated with the defined mask 30 and pad oxide layer 22 over the first active region 18 are removed using conventional techniques known to those skilled in the art. This reveals the silicon layer 14 for the first active region 18 (i.e., the silicon channel layer 14) and the SiGe channel layer 40 for the second active region 20 for further processing such as the fabrication of a CMOS transistor structure.

Figure 7:
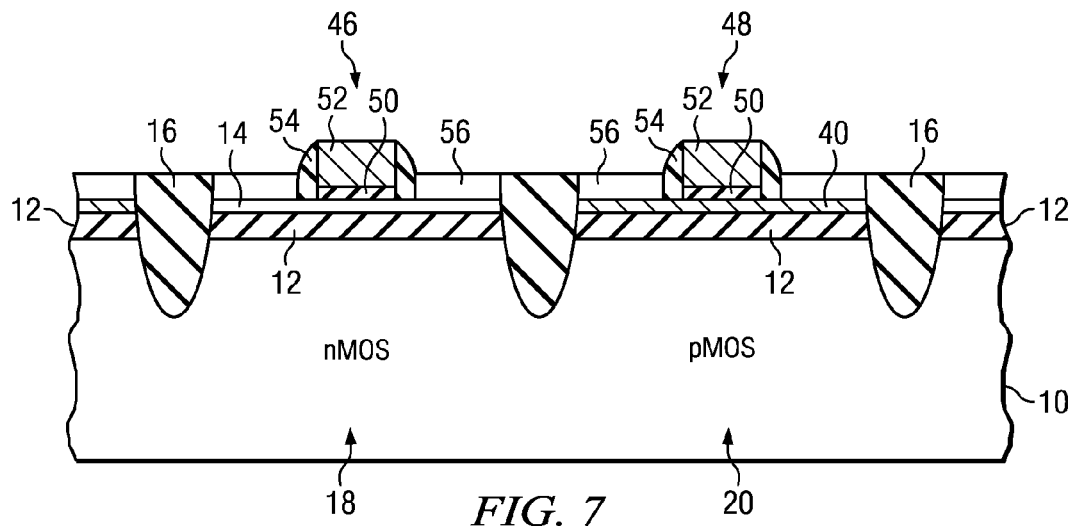
FIG. 7 illustrates a completed CMOS transistor structure from the first process.

FIG. 7 shows the resulting CMOS transistor structure including n-channel and p-channel transistors 46 and 48, respectively, following production, in a manner well known to those skilled in the art, of a gate stack with gate oxide 50, gate electrode 52, sidewall spacers 54 and raised source/drain structures 56 over the Si channel layer 14 for the first active region 18 and SiGe channel layer 40 for the second active region 20. Although not shown, the gate electrode and raised source/drain regions may be silicided. The raised source/drain structures 56 over the Si channel layer 14 for the first active region 18 are preferably epitaxially grown silicon (Si) or silicon carbide (SiC) structures doped with an appropriate dopant such as phosphorous (SiC:P) for making an NMOS transistor. The channel of the transistor 46 is formed by the thin Si channel layer 14 under the gate stack. The raised source/drain structures 56 over the SiGe channel layer 40 for the second active region 20 are preferably epitaxially grown silicon (Si) or silicon germanium (SiGe) structures doped with an appropriate dopant such as boron (SiGe:B) for making a pMOS transistor. The channel of the transistor 48 is formed by the thin SiGe channel layer 40 under the gate stack.

With respect to the STI structures 16, if such structures are not formed initially in the manner shown in FIG. 1, it will be understood that the structures may instead be formed at any point in the process described above prior to the formation of the gate stack. Indeed, the STI structures 16 can be formed before or after SiGeOI formation by epitaxy plus condensation (RTO) as described above.

The Ge concentration of approximately 20-30% in the thin SiGe channel layer 40 under the gate stack is adjusted by controlling the epitaxial growth of the SiGe layer 34 and optional silicon cap layer 36. By adjusting the Ge concentration, control may be exercised over the threshold voltage of the transistor 48.

Reference is now made to FIGS. 8-14 which illustrate a second process flow for CMOS transistor structure fabrication.

Figure 8:
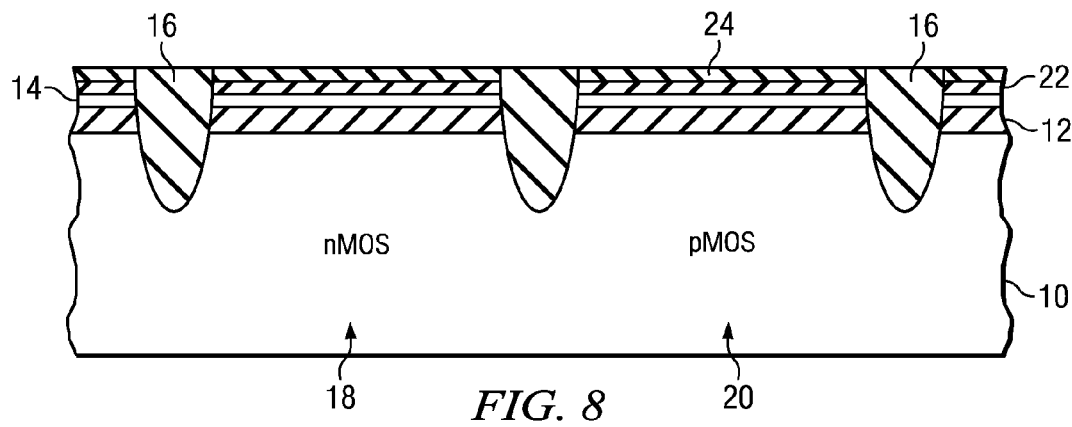

FIG. 8 shows an SOI substrate comprising a lightly doped substrate layer 10, and overlying buried oxide (for example, $SiO_2$) layer 12, and an overlying silicon layer 14. The SOI substrate has been divided by shallow trench isolation (STI) structures 16, for example, formed of $SiO_2$, into a first active region 18 for an nMOS device and a second active region 20 for a pMOS device. The STI structures 16 penetrate through the silicon layer 14 and oxide layer 12 into the lightly doped substrate layer 10. A pad oxide (for example, $SiO_2$) layer 22 and nitride etch stop layer 24 overlie the silicon layer 14. A planarization process has been performed on the structure of FIG. 1, with that planarization process stopping at the nitride etch stop layer 24.

Again, it will be understood that the formation of the STI structures 16 can be reserved, as will be discussed below, for later in the fabrication process if desired. In such a case, the first active region 18 and second active region 20 will be understood to be regions of the substrate that have been allocated for use by the nMOS and pMOS transistors to be fabricated in the manner described.

Figure 9:
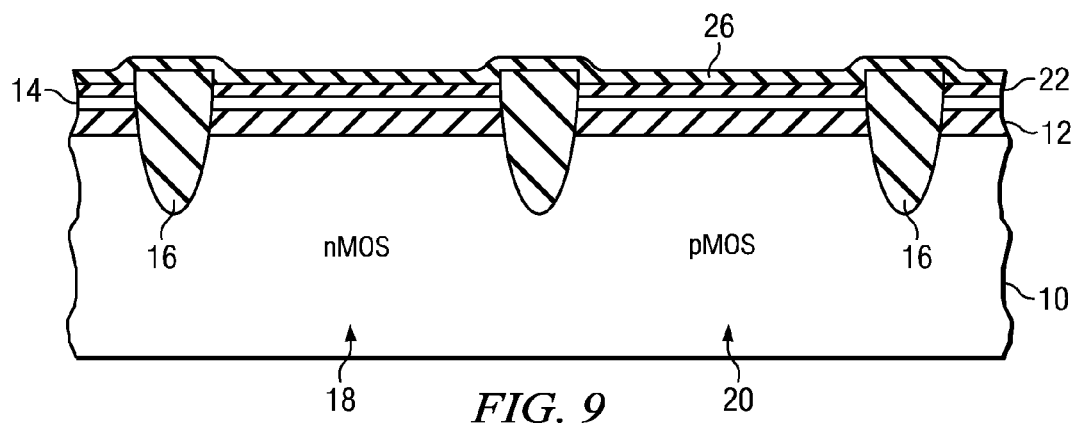

In FIG. 9, the nitride etch stop layer 24 has been removed, and a hard mask layer 26, for example, formed of SiN or $SiO_2$, has been conformally deposited.

Figure 10:
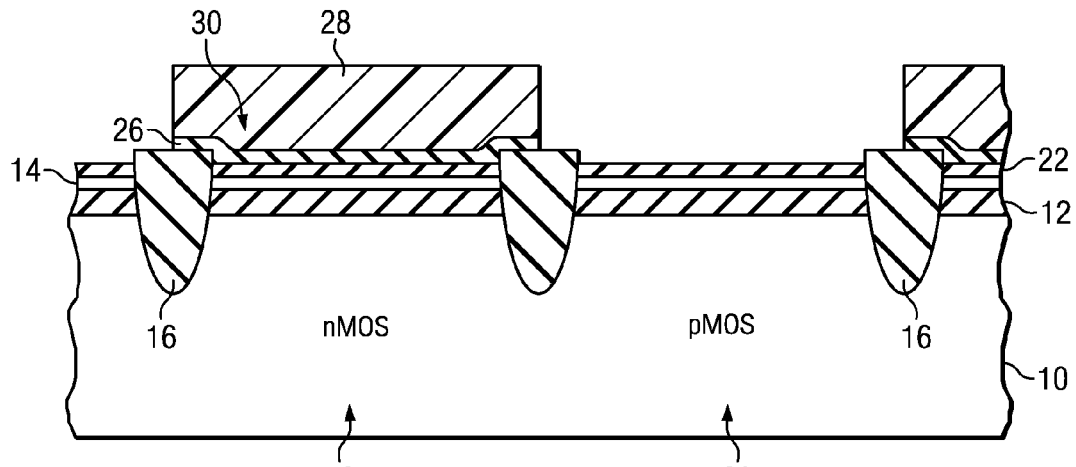

In FIG. 10, a resist material layer 28 is deposited over the hard mask layer 26. The layers 26 and 28 are patterned using conventional photolithography techniques to define a mask 30 which protects the first active region 18 identified for the n-channel devices. The layers 26 and 28 are removed from overlying the second active region 20 identified for the p-channel device.

Figure 11:
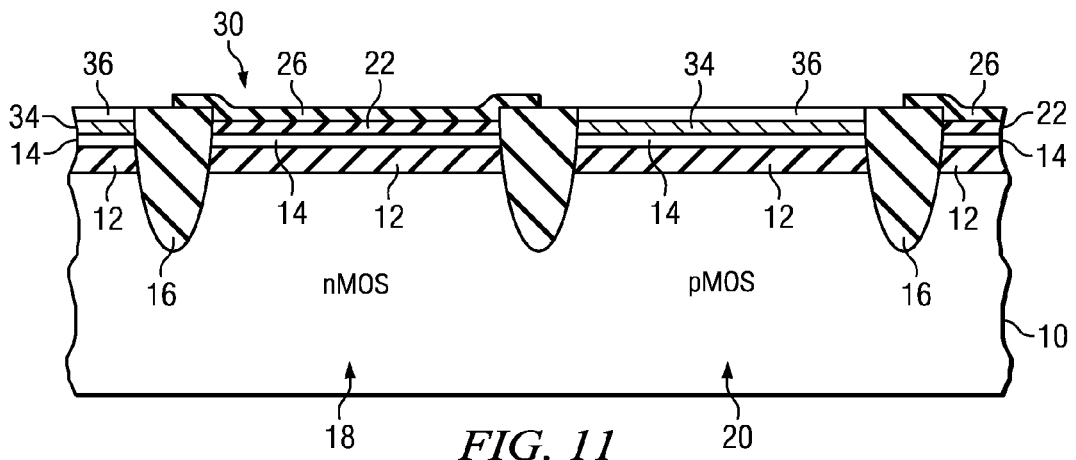

In FIG. 11, the patterned resist layer 28 is removed leaving the hard mask layer 26 associated with the defined mask 30 over the first active region 18. The pad oxide layer 22 located on the silicon layer 14 in the second active region 20 is removed, and a selective epitaxial growth of SiGe is then performed on the exposed silicon layer 14 in the second active region 20 to produce an overlying SiGe layer 34 (having a Ge concentration of 15-25%). The selective epitaxial growth process for the SiGe layer 34 preferably utilizes a cyclic epitaxy process in a manner well known to those skilled in the art. This produces an SiGe+SOI structure in the second active region 20.

An optional silicon layer 36 may be selectively epitaxially grown on the SiGe layer 34. The silicon layer 36 forms a cap. The selective epitaxial growth process for the silicon layer 36 preferably utilizes a cyclic epitaxy process in a manner well known to those skilled in the art.

Figure 12:
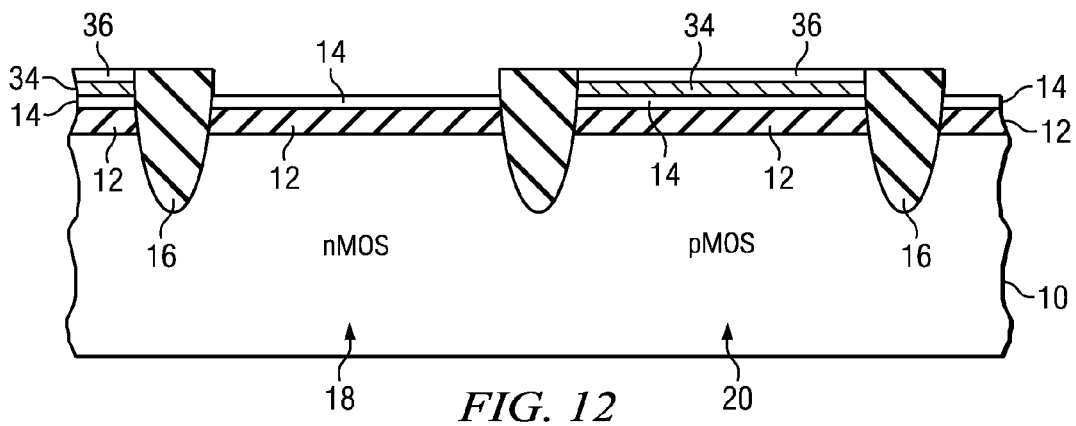

In FIG. 12, the hard mask layer 26 associated with the defined mask 30 is removed along with the pad oxide layer 22 located on the silicon layer 14 in the first active region 18.

In FIG. 13, a condensation technique is performed to preferentially oxidize the Si in both the first and second active regions 18 and 20. In the first active region 18, this condensation technique produces a reduced thickness silicon channel layer 15 along with an overlying oxide ($SiO_2$) layer 41 (i.e., retaining the silicon-based SOI structure in the first active region 18). In the second active region 20, this condensation technique produces a SiGe channel layer 40 overlying the buried oxide layer 12 (i.e., an SiGeOI structure in the second active region 20). The condensation process also produces as a byproduct an oxide ($SiO_2$) layer 42 overlying the SiGe channel layer 40. This SiGe channel layer 40 has a high Ge concentration of approximately 20-30%. The SiGe channel layer 40 for the second active region 20 further has a thickness substantially equal to the reduced thickness of the Si channel layer 15 for the first active region 18. It will be understood that the reduced thickness of the silicon channel layer 15 is controlled by the parameters of the performed condensation technique. It will further be understood that the thickness of the SiGe channel layer 40 is controlled by the thickness of the epitaxially grown SiGe layer 34 (and optional silicon cap layer 36) and the parameters of the performed condensation technique. Although a substantially equal thickness is preferred (as illustrated in FIG. 13), it will be understood that some implementations may benefit from different thicknesses in the first and second active regions 18 and 20, respectively.

The condensation technique may comprise, for example, a rapid thermal oxidation (RTO) process well known to those skilled in the art. The effect of performing the condensation technique on the Si layer 14, the epitaxial SiGe layer 34 and optional silicon cap layer 36 is to thin the silicon layer 14 in the first active region 18 producing thinned silicon channel layer 15, drive in germanium to form a SiGeOI substrate structure with SiGe channel layer 40 in the second active region 20, and produce the silicon oxide layers 41 and 42 which can be subsequently removed to expose the thinned silicon layer channel 15 in the first active region 18 and the SiGe channel layer 40 for the second active region 20.

In FIG. 14, the oxide layers 41 and 42 over the first and second active regions 18 and 20, respectively, are removed using conventional techniques known to those skilled in the art. This reveals the thinned silicon channel layer 15 for the first active region 18 and the SiGe channel layer 40 for the second active region 20 for further processing such as the fabrication of a CMOS transistor structure.

FIG. 15 shows the resulting CMOS transistor structure including n-channel and p-channel transistors 46 and 48, respectively, following production, in a manner well known to those skilled in the art, of a gate stack with gate oxide 50, gate electrode 52, sidewall spacers 54 and raised source/drain structures 56 over the Si channel layer 15 for the first active region 18 and SiGe channel layer 40 for the second active region 20. Although not shown, the gate electrode and raised source/drain regions may be silicided. The raised source/drain structures 56 over the Si channel layer 15 for the first active region 18 are preferably epitaxially grown silicon (Si) or silicon carbide (SiC) structures doped with an appropriate dopant such as phosphorous (SiC:P) for making an NMOS transistor. The channel of the transistor 46 is formed by the thin Si channel layer 15 under the gate stack. The raised source/drain structures 56 over the SiGe channel layer 40 for the second active region 20 are preferably epitaxially grown silicon (Si) or silicon germanium (SiGe) structures doped with an appropriate dopant such as boron (SiGe:B) for making a pMOS transistor. The channel of the transistor 48 is formed by the thin SiGe channel layer 40 under the gate stack.

The Ge concentration of approximately 20-30% in the thin SiGe channel layer 40 under the gate stack is adjusted by controlling the epitaxial growth of the SiGe layer 34 and optional silicon cap layer 36. By adjusting the Ge concentration, control may be exercised over the threshold voltage of the transistor 48.

Although FIGS. 5 and 13 illustrate the preferred use of a condensation technique to preferentially oxidize Si, in an alternative implementation a thermal mixing technique could be used. Thermal mixing performs a thermal annealing operation on the structures shown in FIGS. 4 and 12. Such a thermal anneal will cause the Ge from the epitaxial SiGe layer 34 to diffuse into the underlying silicon layer 14 to form a thick SiGe layer (such as layer 40). To achieve a desired thickness for the SiGe channel layer 40 in the second active region, a thinning operation is performed, for example using an etch, to reduce the thickness of the thick SiGe channel layer 40 to be substantially equal to the thickness of silicon layer 14 in the first active region 18.

The condensation technique is preferred over the thermal mixing technique because it produces a SiGe channel layer 40 with a higher Ge content. For comparison purposes, the Ge content of the SiGe channel layer 40 produced from a thermal anneal and thinning is about 8%-15%, while the Ge content of the SiGe channel layer 40 produced thermal oxidation is about 20%-30%.

In an exemplary implementation, applicable to the process of FIGS. 1-6 and the process of FIGS. 8-14, the thickness of the SiGe channel layer 40 in the second active region is 5-10 nm, and this thickness is substantially equal to the thickness of the silicon layer 14 or thinned silicon layer 15.

Figure 16:
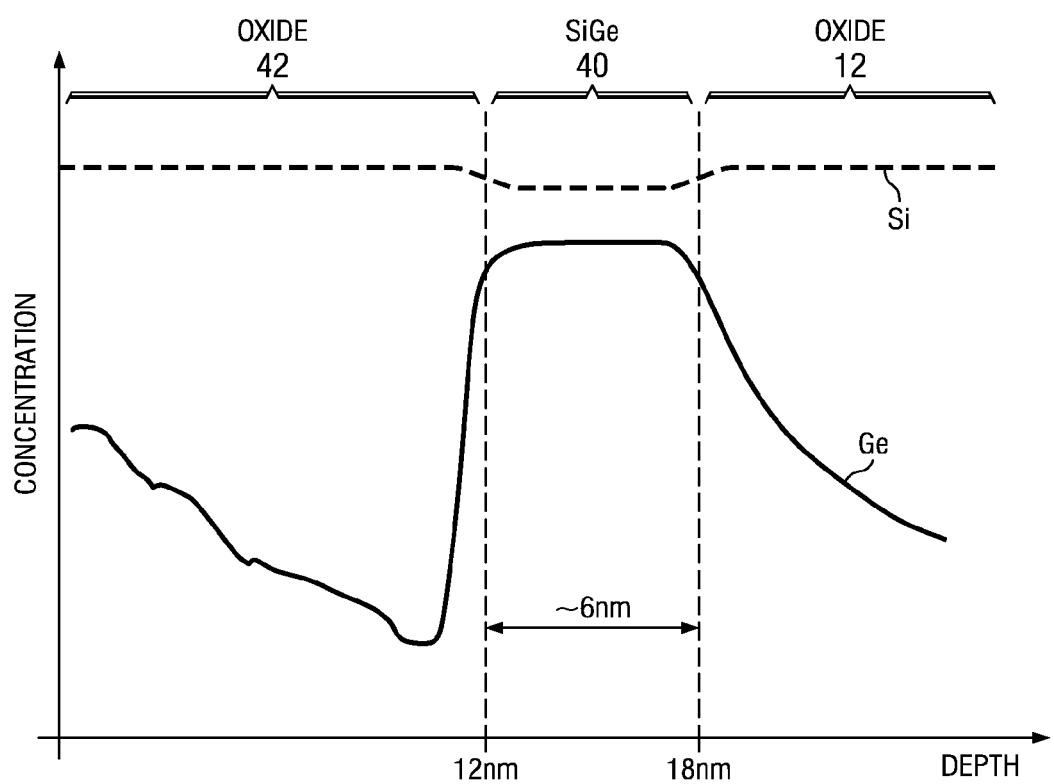
FIG. 16 is a graph illustrating the measurement of Si and Ge dopant concentrations as a function of depth in the structures shown in FIGS. 5 and 13.

Reference is now made to FIG. 16 which is a graph illustrating the measurement of dopant concentrations as a function of depth for an exemplary product as shown in FIGS. 5 and 13. More specifically, FIG. 16 shows a secondary ion mass spectroscopy (SIMS) plot of Si and Ge content as a function of depth in the second active region 20. It should be noted that the Ge content is substantially constant throughout the approximately 6 nm thickness of the SiGe channel layer 40. The Ge content in the SiGe channel layer 40 is approximately 23%.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A method, comprising:
protecting a first region of an SOI substrate with a patterned layer which leaves a second region exposed;
depositing an SiGe layer on top of the exposed second region of the SOI substrate;
removing the patterned layer to expose both the SOI substrate in the first region and the SiGe layer in the second region;
then simultaneously thermally oxidizing the exposed SOI substrate in the first region and the SiGe layer in the second region to form a thinned SOI substrate with a reduced thickness Si layer in the first region and introduce Ge from the SiGe layer to form an SiGeOI substrate in the second region with an oxide layer overlying the thinned SOI substrate in the first region and overlying the SiGeOI substrate in the second region; and
removing the oxide layer.

2. The method of claim 1, further comprising forming a transistor on the SiGeOI substrate in the second region.

3. The method of claim 2, wherein the forming the transistor comprises providing a gate stack on top of the SiGeOI substrate, an SiGe channel layer of the SiGeOI substrate under the gate stack comprising a channel of the transistor.

4. The method of claim 3, wherein the SiGe channel layer of the SiGeOI substrate has a thickness of about 5-10 nm and a Ge content of between 20-30%.

5. The method of claim 4, wherein the reduced thickness Si layer of the thinned SOI substrate has a thickness of about 5-10 nm.

6. The method of claim 3, wherein the forming the transistor further comprises producing raised source and drain regions from the top of the SiGeOI substrate adjacent the gate stack.

7. The method of claim 1, further comprising forming a shallow trench isolation structure configured to isolate between the first region and the second region.

8. The method of claim 1, further comprising forming a transistor on the reduced thickness Si layer of the thinned SOI substrate in the first region.

9. The method of claim 8, wherein the forming the transistor comprises providing a gate stack on top of the reduced thickness Si layer, the reduced thickness Si layer providing an Si channel layer under the gate stack comprising a channel of the transistor.

10. The method of claim 9, wherein both the Si channel layer of the thinned SOI substrate and an SiGe channel layer of the SiGeOI substrate have thicknesses of about 5-10 nm and the SiGe channel layer of the SiGeOI substrate has a Ge content of between 20-30%.

11. The method of claim 9, wherein the forming the transistor further comprises producing raised source and drain regions from the top of the thinned SOI substrate adjacent the gate stack.

12. A method, comprising:
protecting a first region of an SOI substrate with a patterned layer that exposes a second region;
depositing an SiGe layer on top of the SOI substrate in the exposed second region;
removing the patterned layer to expose both the SiGe layer of the second region and an Si layer of the first region;
then simultaneously thermally oxidizing the exposed Si layer and SiGe layer so as to form a thinned SOI structure with a reduced thickness Si channel layer in the first region and drive in Ge from the SiGe layer to form an SiGeOI structure in the second region;
forming a first transistor gate stack over a top surface of the reduced thickness Si channel layer of the thinned SOI structure in the first region; and
forming a second transistor gate stack over a top surface of the SiGeOI structure defining an SiGe channel layer provided in the second region.

13. The method of claim 12, wherein the first transistor gate stack is part of an n-channel MOS transistor and the second transistor gate stack is part of a p-channel MOS transistor.

14. The method of claim 12, wherein the simultaneously thermally oxidizing produces an oxide layer over both the reduced thickness Si channel layer and the SiGe channel layer, the method further comprising removing the oxide layer before the forming of the first and second transistor gate stacks.

15. The method of claim 12, further comprising forming a shallow trench isolation structure configured to isolate between the first region and the second region.

16. The method of claim 12, wherein the forming the first and second transistors further comprises producing raised source and drain regions.

17. The method of claim 12, wherein both the reduced thickness Si channel layer and the SiGe channel layer have thicknesses of about 5-10 nm and the SiGe channel layer has a Ge content of between 20-30%.

* * * * *